United States Patent [19]
Narayanan et al.

[11] Patent Number: 5,881,067
[45] Date of Patent: Mar. 9, 1999

[54] FLIP-FLOP DESIGN AND TECHNIQUE FOR SCAN CHAIN DIAGNOSIS

[75] Inventors: Sridhar Narayanan; Ashutosh Das, both of Sunnyvale, Calif.

[73] Assignee: Sun Microsystems, Inc., Mountain View, Calif.

[21] Appl. No.: 789,256

[22] Filed: Jan. 28, 1997

[51] Int. Cl.$^6$ .................................................. G01R 31/28

[52] U.S. Cl. ................... 371/22.31; 371/22.6; 324/73.1; 377/73; 377/75

[58] Field of Search ............................. 371/22.31, 22.34, 371/22.32, 22.36, 22.1, 22.6, 3, 21.3; 395/183.06; 324/73.1; 377/64, 73, 75, 76, 77, 81

[56] References Cited

U.S. PATENT DOCUMENTS

| | | | |
|---|---|---|---|
| 4,855,669 | 8/1989 | Mahoney | 324/73.1 |
| 5,367,551 | 11/1994 | Okumura et al. | 377/77 |
| 5,416,784 | 5/1995 | Johnson | 371/22.5 |
| 5,574,731 | 11/1996 | Qureshi | 371/22.31 |

OTHER PUBLICATIONS

S. Edirisooriya and G. Edirisooriya, "Diagnosis of Scan Path Failures," Proceeding of 13th IEEE VLSI Test Symposium, Apr. 1995, Princeton, NJ pp. 250–255.

S. Kundu in Proceedings, "On Diagnosis of Faults in a Scan Chain," 11th IEEE VLSI Test Symposium, Apr. 1993, pp. 303–308.

*Primary Examiner*—Trinh L. Tu
*Attorney, Agent, or Firm*—Skjerven, Morrill, MacPherson, Franklin & Friel; Brian D. Ogonowsky

[57] ABSTRACT

A modification to conventional scan chain design is disclosed which can identify whether any connection in the scan chain is shorted to the supply voltage or ground (i.e., shorted to a logical 1 or logical 0) and the precise location of the short. Circuitry in the flip-flops (or other sequential elements) forming the scan chain allows the scan output of each flip-flop to be set or reset by switching a scan enable signal between logic states. If there is a fault in the scan chain where a node is stuck at a logical 1, then resetting the scan outputs of the flip-flops to 0 and clocking the flip-flops will result in a logical 1 being output from the last flip-flop after a number of clock pulses. The number of clock pulses indicates the position of the flip-flop in the scan chain which is associated with the fault. A similar technique detects a stuck-at-0 fault by setting the flip-flops to 1. In a preferred embodiment, each adjacent pair of flipflops in the chain consists of a flip-flop whose scan output can be reset to a 0 and a flip-flop whose scan output can be set to a 1.

19 Claims, 4 Drawing Sheets

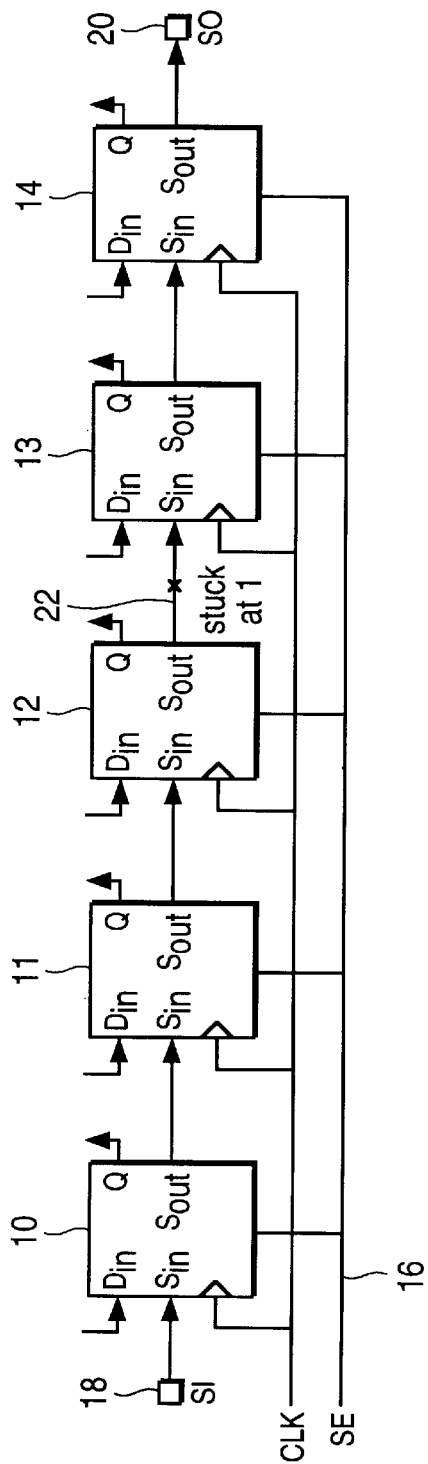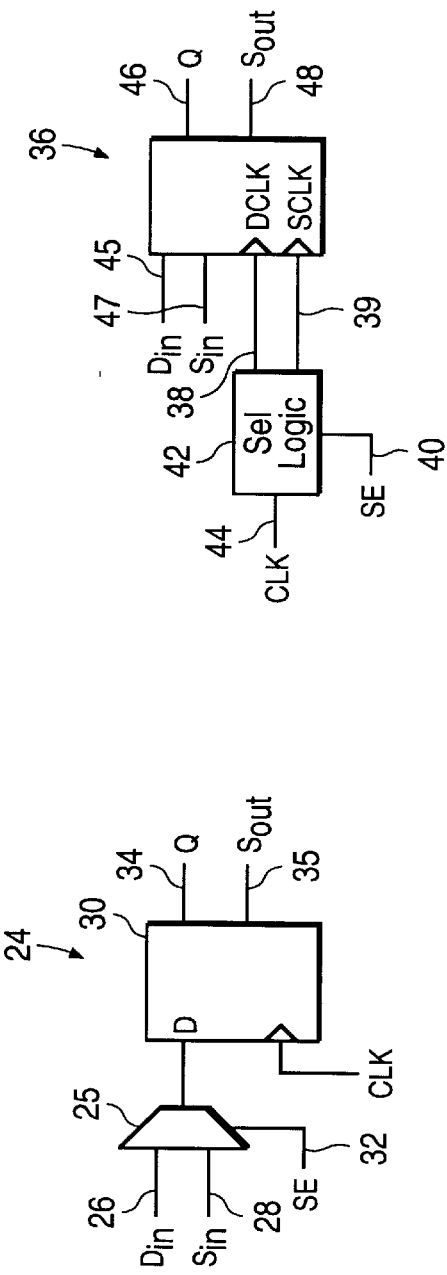

FLIP-FLOP DESIGN AND TECHNIQUE FOR SCAN CHAIN DIAGNOSIS

FIELD OF THE INVENTION

This invention relates to a diagnostic technique for integrated circuits and, in particular, to a diagnostic technique for a plurality of sequential storage elements in an integrated circuit.

BACKGROUND OF THE INVENTION

Current microprocessors have a huge number of flip-flops (e.g., greater than 10,000). When testing or debugging the integrated circuit design, it is important to not only identify that a defect exists in the circuit, but the location and root cause of the defect. The use of scan design techniques to efficiently test and debug sequential circuits is a widely accepted industrial practice. In scan design, some or all flip-flops (or other sequential elements) in a circuit are linked into one or more scan chains. This permits data to be serially shifted into and out of these flip-flop chains, greatly enhancing controllability and observability of internal nodes in the design. If the data shifted into the scan chain comes out of the scan chain as predicted, it is determined that the flip-flops that make up the scan chain are not faulty.

After the circuit has been debugged and corrected, if necessary, the scan mechanism can be disabled, and the flip-flops may operate independently of one another.

In using scan design to test or debug a circuit, it is imperative that the scan chain itself not be defective. A defective scan chain will prevent the inputted data from being properly shifted through the chain and invalidate the testing of other parts of the logic.

Accordingly, what is needed is a design for sequential elements, such as flip-flops, which can be used to test or debug a circuit design via scanning, and in which any defects in the scan chain may be identified and precisely located.

SUMMARY

A modification to conventional scan chain design is disclosed which can identify whether any connection in the scan chain is shorted to the supply voltage or ground (i.e., shorted to a logical 1 or logical 0) and the precise location of the short.

During a scan test of flip-flops connected in a scan chain, a series of logical 1's are applied to the input of the first flip-flop in the scan chain, and the flip-flops in the chain are clocked until the 1's are outputted from the last flip-flop. A series of 0's are then applied to the input of the first flip-flop and are clocked through the chain until outputted. If the number of clock pulses needed to shift the 1's or 0's through the entire chain equals the number of flip-flops, then the flip-flops in the chain pass the test. If there is a defect, then the source of the defect must be determined. The following technique identifies whether the source of the defect is in the scan chain circuitry itself and the location of the defect in the scan chain.

Circuitry in the flip-flops, in accordance with the invention, allows the scan output of each flip-flop to be either set or reset. If there is a fault in the scan chain where a node is stuck at a logical 1, then resetting the scan outputs of the flip-flops to 0 and clocking the flip-flops will result in a logical 1 being outputted from the last flip-flop after a number of clock pulses. The number of clock pulses indicates the position of the flip-flop in the scan chain which is associated with the fault.

If a node in the scan chain is stuck at a logical 0, the scan outputs of the flip-flops in the scan chain are set to a logical 1, and the flip-flops are clocked. The number of clock pulses until a 0 reaches the scan output of the last flip-flop identifies the position of the flip-flop associated with the fault.

Circuitry is disclosed which allows the setting and resetting of the scan outputs of the flip-flops without any set and reset control terminals. This allows the scan chain to be operated with the same control signals which are already used throughout the industry.

In a preferred embodiment, each adjacent pair of flip-flops in the chain consists of a flip-flop whose scan output can be reset to a 0 and a flip-flop whose scan output can be set to a 1. Thus, during a diagnostic test routine to determine a fault in the scan chain, the scan outputs of alternate flip-flops are reset to 0, and the scan outputs of the remaining flip-flops are set to 1. Applying clock pulses to the flip-flops will cause the pattern 0, 1, 0, 1 . . . to be outputted from the last flip-flop until the node which is stuck at 0 or 1 causes the output to be all 0's or all 1's. The number of clock pulses before the output becomes all 0's or all 1's uniquely corresponds to a particular flip-flop pair, and a correction can then be easily made.

BRIEF DESCRIPTION OF THE DRAWINGS

FIG. 1 illustrates a plurality of flip-flops in a scan chain.

FIG. 2 illustrates a single flip-flop in a scan chain in accordance with one embodiment of the invention.

FIG. 3 illustrates a single flip-flop in a scan chain in accordance with another embodiment of the invention.

DETAILED DESCRIPTION OF THE PREFERRED EMBODIMENTS

Figure 4:
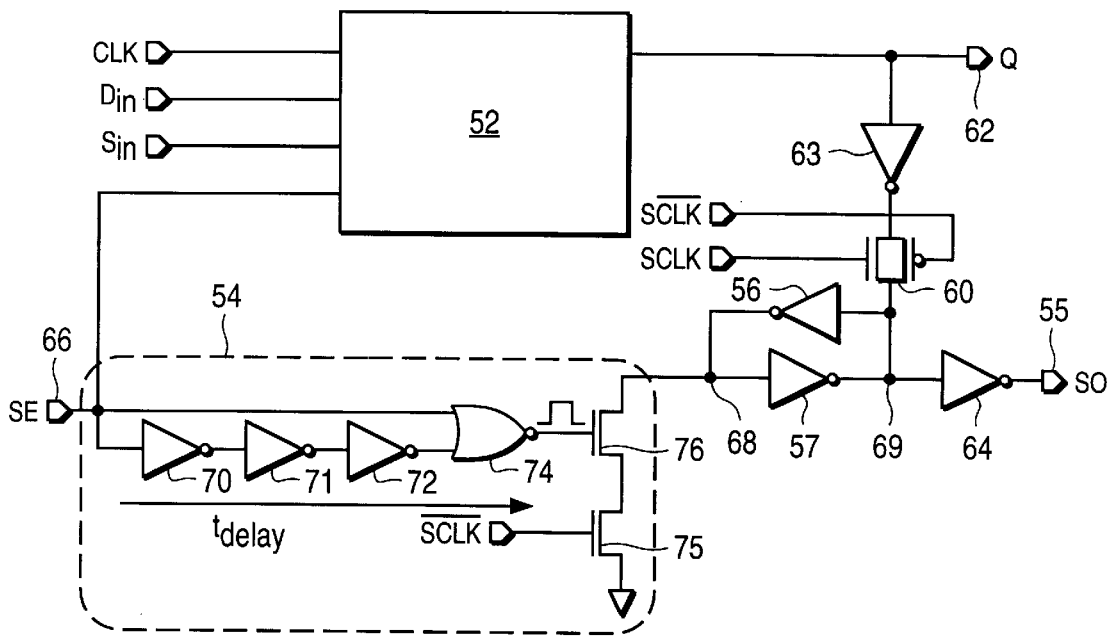
FIG. 4 illustrates in greater detail the reset and set circuitry for the scan output of each flip-flop in the scan chain.

FIG. 1 illustrates five flip-flops 10–14 connected in a scan chain. A scan enable (SE) signal on line 16 is applied to each of the flip-flops and causes each of the flip-flops to respond to a scan-in ($S_{in}$) signal applied to its $S_{in}$ terminal. The scan output ($S_{out}$) terminal of one flip-flop is connected to the $S_{in}$ terminal of the next flip-flop. In the particular example shown in FIG. 1, each of the flip-flops 10–14 is a D flip-flop whose $S_{out}$ terminal outputs the same signal applied to its $S_{in}$ terminal upon the next clock (CLK) pulse.

When debugging and testing the integrated circuit incorporating flip-flops 10–14, the SE signal is asserted and a sequence of logical 1's is applied to the scan input (SI) node 18 connected to the $S_{in}$ terminal of flip-flop 10. If the scan chain is working properly, after five clock (CLK) cycles, the first logical 1 applied to terminal 18 is outputted to the scan output (SO) node 20 and detected.

A sequence of 0's is then shifted into the chain via node 18 while the SE signal is asserted. At the end of the fifth clock cycle, a 0 should be observed at the SO node 20.

Defects in the scan chain will cause the scan chain to fail the above test.

In the example shown in FIG. 1, the connector 22 between the $S_{out}$ terminal and the $S_{in}$ terminal of flip-flops 12 and 13 is indicated as being permanently tied to a logical 1 voltage. This may be due to a short between the connector 22 and a power supply terminal or may be due to a faulty logic design which continually applies a logical 1 to connector 22. Hence, when shifting in 0's from node 18, the scan chain in FIG. 1 will output a continuous sequence of 1's, and, thus, a fault is detected. Although a fault has been detected in the scan chain, the exact location of the fault is unknown. For example, the stuck-at-1 fault could be located at the scan inputs to any of the five flip-flops 10–14.

In accordance with one embodiment of the invention, having detected the series of 1's at the SO node 20, indicating a fault in the scan chain, the following steps are carried out. The clock (CLK) is held low, and the SE signal on line 16 is pulsed from a logical 1 to a 0 and back again to 1. The net result of the signal transition on SE line 16 is to force the $S_{out}$ terminals of all or a subset of flip-flops 10–14 to reset to 0. The clock is now restarted and, on the first clock pulse, a 0 is output at the SO node 20. However, on the second clock pulse, a 1 is obtained at the SO node 20 due to the stuck-at-1 fault at the scan input to flip-flop 13. The presence of a 1 at that clock pulse identifies that the defect is located between flip-flops 12 and 13.

A similar technique can be used to diagnose a stuck-at-0 fault in the scan chain due to connector 22 being shorted to ground. To diagnose the stuck-at-0 fault, the SE line 16 is switched from a logical 1 to a 0 and back again to 1 to set the $S_{out}$ terminals of all or a subset of flip-flops 10–14 to 1. In such a case, after two clock cycles the output at SO node 20 will switch from a 1 to a 0, indicating that the fault is a ground fault between flip-flops 12 and 13.

FIGS. 2, 3, 4, 6, 7, and 8 illustrate various circuit techniques for forming flip-flops which may be used in the scan chain of FIG. 1. Those flip-flops may be set or reset to carry out the inventive process described above for identifying a fault in the scan chain and the location of the fault.

FIG. 2 illustrates a general construction of one flip-flop 24 in accordance with one embodiment of the invention. A multiplexer 25 selects either the D input 26 or the scan input 28 to be applied to the D flip-flop logic 30. The SE signal on line 32 is coupled to the control input of multiplexer 25 to select either the signal $D_{in}$ or $S_{in}$. The Q terminal 34 is used during the normal operation of the flip-flop, and the $S_{out}$ terminal 35 is used for the scan chain when the SE signal is asserted.

FIG. 3 illustrates another embodiment of a flip-flop 36 which may be used in a scan chain. Flip-flop 36 has both a DCLK input terminal 38 and a SCLK input terminal 39. The SE signal on line 40 is applied to a select logic circuit 42 to select whether a clock (CLK) signal 44 is to be applied to the DCLK terminal 38 or the SCLK terminal 39. A CLK signal applied to the DCLK terminal 38 clocks the $D_{in}$ input 45 to the Q terminal 46, and a CLK signal applied to the SCLK terminal 39 clocks the $S_{in}$ input 47 to the $S_{out}$ terminal 48.

It is desired that a minimum number of transistors be added to the conventional flip-flop to implement the present invention, that no additional control terminals be added, and that no additional control signals be required. This is so that little additional silicon area is required and so that all control may be conducted using the SE signal. Accordingly, the preferred design does not require reset and set terminals for the various flip-flops. The preferred embodiments described in the following figures allow for the set and reset of the various flip-flops using only the SE signal. In one embodiment, only 12 transistors are required to implement the set/reset feature. The number of transistors may be reduced using known circuit techniques.

FIG. 4 illustrates one embodiment of a single flip-flop 50 incorporating conventional D flip-flop functions as well as the scan function and a set or reset function. The flip-flop 50 is to be used in the scan chain of FIG. 1. A logic portion 52 of the flip-flop provides the select logic and D flip-flop logic circuitry described with respect to FIG. 3, whose details would be understood by those skilled in the art after reading this disclosure. In another embodiment, the logic portion 52 contains different logic for performing the required function.

A reset/set circuit 54 is shown within the dashed line. This circuit 54 is used to set or reset the scan output (SO) terminal 55 to either a 1 or 0, depending upon whether the reset/set circuit 54 is connected as a reset circuit or a set circuit.

In FIG. 4, the flip-flop 50 design is a dual-clock (DCLK and SCLK) scan flip-flop with a separate scan slave latch formed using inverters 56 and 57. The input into the latch is controlled by a transmission gate 60, controlled by the scan clock signals SCLK and $\overline{SCLK}$. The Q terminal 62 of the logic portion 52 is connected to the SO terminal 55 via inverter 63 and inverter 64 so that the SO terminal 55 latches to the logic value on Q terminal 62 after the SCLK clock pulses.

Upon assertion of the scan enable (SE) signal on terminal 66 and actuation of the CLK signal, the scan-in $S_{in}$, signal applied to logic portion 52 will be transferred, via the Q terminal 52 and through the transmission gate 60, to the SO terminal 55 and latched.

The reset/set circuit 54 is either connected to node 68 for resetting the SO output to 0 or connected to node 69 for setting the SO output to 1. The reset/set circuit 54 consists of a delay circuit, which may consist of a series of inverters 70, 71, 72. Other types of delay circuits may also be used. The SE signal as well as the delayed output of inverter 72 are connected to the inputs of a NOR gate 74. Upon switching the SE signal from a 1 to a 0, a short pulse having a duration equal to the delay of inverters 70–72 and NOR gate 74 is outputted from NOR gate 74. This is because immediately after the signal SE switches to 0, a 0 still appears at the delayed output of inverter 72 for a brief period. The two 0's applied to the inputs of NOR gate 74 cause the NOR gate 74 to output a 1.

When $\overline{SCLK}$ goes high, it turns on transistor 75. If the output of NOR gate 74 is 1 while $\overline{SCLK}$ is high, this turns on transistor 76, which pulls down node 68. This causes the SO terminal 55 to be reset to a 0 state. If the drain of transistor 76 were connected to node 69, the SO terminal 55 would be set to a 1 state.

Assuming the flip-flop 50 of FIG. 4 is connected in the chain illustrated in FIG. 1, sequences of 1's and 0's are applied to the scan chain as previously described to determine if the scan chain operates properly. If no fault is detected, the testing using the scan chain is completed. If a fault is detected, then the reset/set circuitry 54 and the following technique is used.

Figure 5:
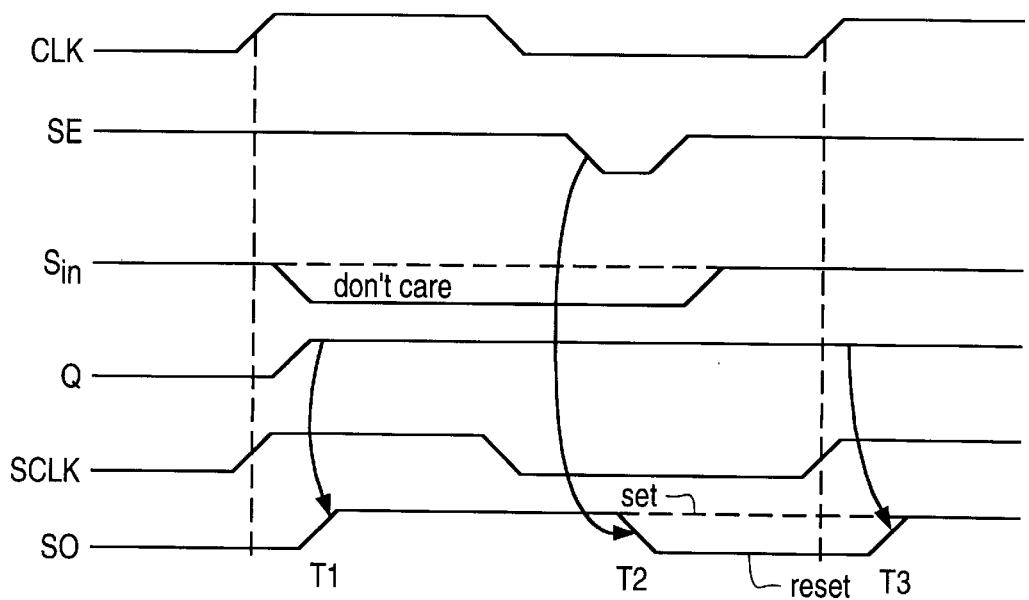
FIG. 5 is timing diagram of a technique for resetting a scan output of the flip-flop of FIG. 4.

Alternate flip-flops 50 in the scan chain have the reset/set circuit 54 connected to node 68 such that circuit 54 acts as a reset circuit. The remaining flip-flops have the reset/set circuit 54 connected to node 69 so that the circuit 54 acts as a set circuit. Accordingly, the scan chain is formed of pairs of flip-flops, where one flip-flop in the pair can have its SO terminal 55 reset, and the other flip-flop in the pair can have its SO terminal 55 set. After it is detected that there is a fault in the scan chain, the resettable flip-flops must be reset and the settable flip-flops must be set. FIG. 5 illustrates the timing diagram used to perform this function.

At around time T1, it is illustrated how a logical 1 applied to the $S_{in}$ input, while SE is asserted, is clocked by the rising edge of the SCLK signal to the Q terminal 62 and then to the SO terminal 55. To reset the flip-flop, the SE signal is driven low at time T2 while CLK (or SCLK) is low. This causes two 0's to appear at the input of NOR gate 74, which pulls node 68 down, causing a 0 to appear at the SO terminal 55 irrespective of the signal applied to the $S_{in}$ terminal. If the reset/set circuit 54 were connected to node 69, the SO terminal 55 would be set to a 1 state in response to the SE signal going low. Assuming the $S_{in}$ signal is high prior to the next rising edge of CLK, at T3 the SO terminal 55 is driven high upon application of the clock pulses CLK and SCLK. If the reset/set circuitry 54 were connected to node 69, then the SO terminal 55 would follow the set timeline shown in FIG. 5.

Accordingly, at time T2, alternative flip-flops in the scan chain are reset and the remaining flip-flops in the scan chain are set. The SE signal now remains at a logical 1 and the CLK and SCLK pulses are applied to all the flip-flops. If the scan chain were working properly, 1's and 0's would be output from the scan chain reflecting the reset and set values of the flip-flops. If the scan chain had a stuck-at-1 fault between flip-flops 12 and 13, as shown in FIG. 1, and assuming flip-flop 14 was initially in a set state, the clocked output would be 1, 0, 1, 1, 1, . . . . Thus, it is known that the fault is a stuck-at-1 fault between either flip-flops 12 and 13 or between flip-flops 11 and 12. This fault may then be easily found and corrected.

A reset/set pair of flip-flops may be located at intervals in a scan chain so that a fault can be isolated to a particular interval.

Figure 6:
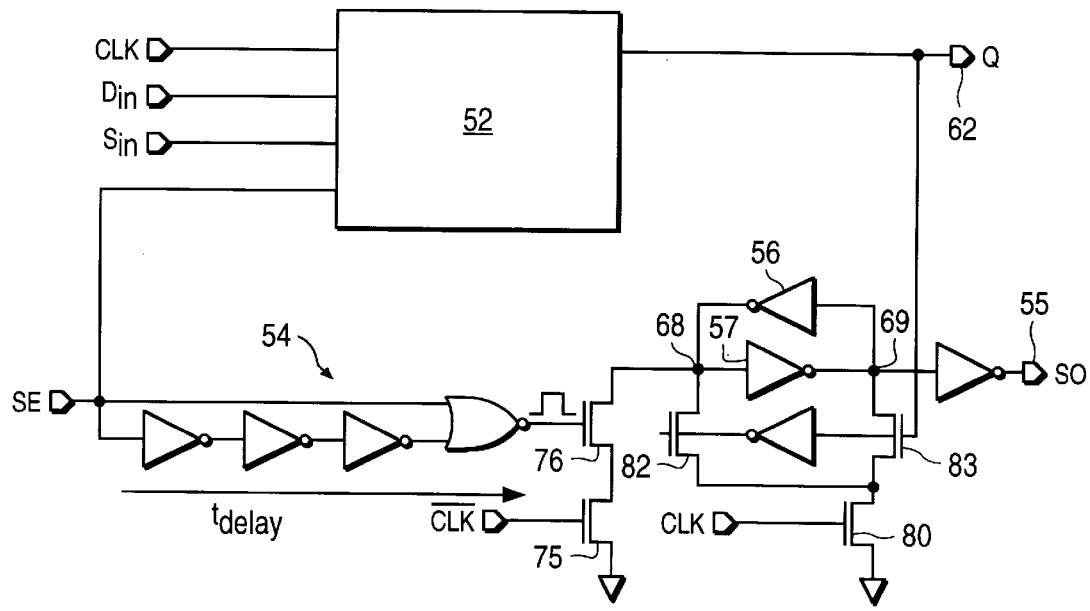
FIG. 6 is an alternative embodiment of a flip-flop whose scan output can be set or reset.

Numerous modifications to the flip-flop of FIG. 4 may be made while using the concepts of this invention. For example, FIG. 6 illustrates another embodiment of the invention, where the same numerals in the various figures may represent the same elements. The logic portion 52 of the flip-flop provides the multiplexing and D flip-flop logic circuitry described with respect to FIG. 2. In FIG. 6, the reset/set circuit 54 may be identical to that in FIG. 4 except that a $\overline{CLK}$ signal is applied to transistor 75 and a SCLK signal is not generated. The reset signal at node 68 is pulled down when the SE signal transitions from a 1 to a 0 and the $\overline{CLK}$ is driven high. This resets the SO terminal 55. Subsequently, the SO terminal 55 follows the logical value on the Q terminal 62 when the CLK signal turns on transistor 80, either pulling down node 68 or 69 via transistors 82 or 83, depending upon the logic state at the Q terminal 62.

Figure 7:
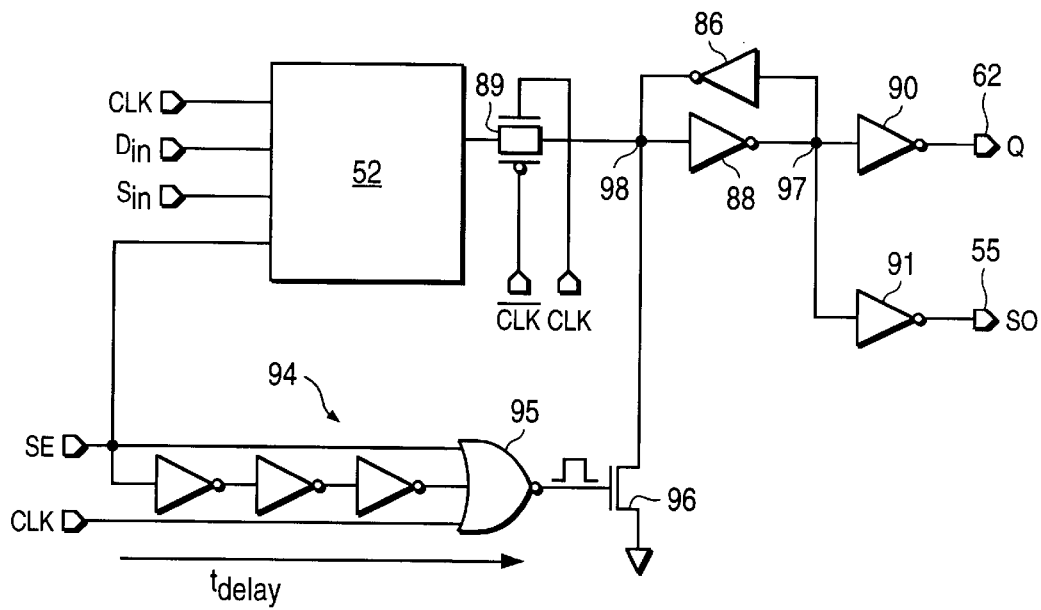
FIG. 7 is another alternative embodiment of a flip-flop whose scan output can be set or reset.

FIG. 7 illustrates another embodiment of the invention where the output of the logic portion 52 is latched via inverters 86 and 88 upon passing through the transmission gate 89. The latched signal is then applied to the Q terminal 62 and the SO terminal 55 via inverters 90 and 91, respectively. Resetting of the SO terminal 55 is performed by the reset/set circuit 94, where the NOR gate 95 outputs a pulse when the SE signal transitions from a 1 to a 0 and the CLK signal applied to NOR gate 95 is low. This pulse turns on the pull down transistor 96. This pulls down node 98 to reset the SO terminal 55. If transistor 96 were connected to node 97, then turning on transistor 96 would set the SO terminal 55. This implementation would increase the CLK to Q time slightly but has comparatively less area impact.

Figure 8:
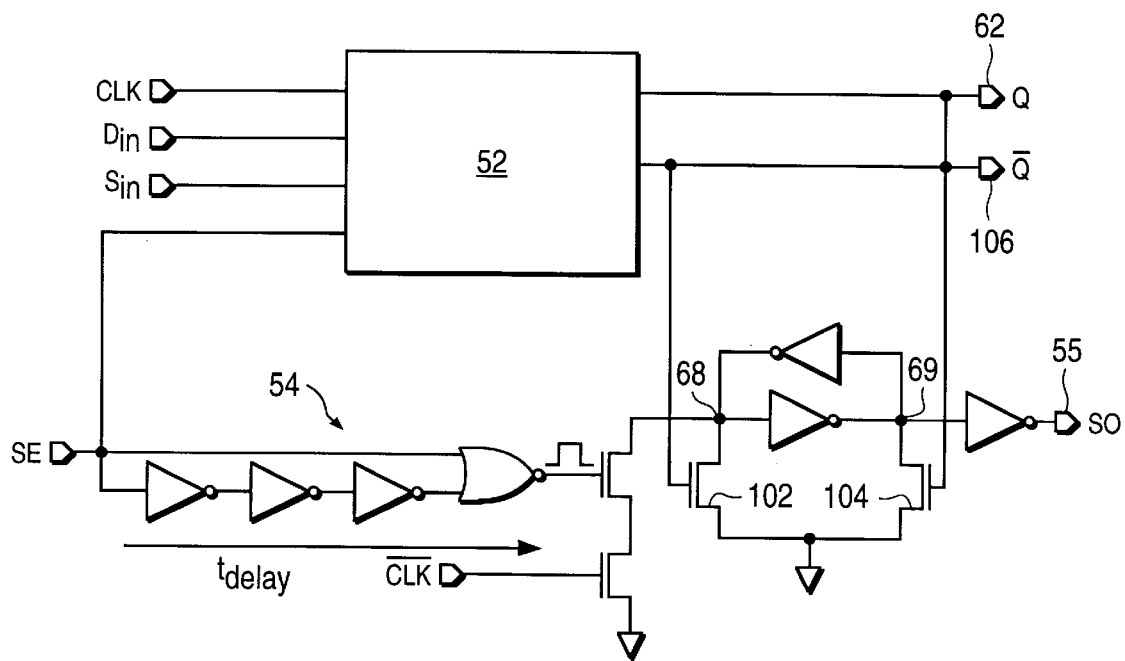
FIG. 8 is yet another alternative embodiment of a flip-flop whose scan output can be set or reset.

FIG. 8 illustrates another embodiment of the invention where the SO terminal 55 is slaved to the Q terminal 62 by pull down transistors 102 and 104. The control terminal of transistor 102 is connected to the $\overline{Q}$ terminal 106, and the control terminal of transistor 104 is connected to the Q terminal 62. The SO terminal 55 resets when the SE signal goes from a 1 to a 0 and when $\overline{CLK}$ is high. The SO terminal 55 may be set by connecting the reset/set circuit 54 to node 69.

As in FIG. 4, the flip-flops of FIGS. 6, 7, and 8 would be made alternately resettable and settable when used in the scan chain of FIG. 1 or reset/set pairs of flip-flops would be employed at intervals in a scan chain.

Other embodiments of flip-flops or other sequential circuit elements using the reset/set circuitry 54 and techniques associated with that circuitry to reset and set a scan chain output are also envisioned by this invention.

The time delay provided by the inverters 70, 71, and 72 may be increased or decreased by using more or less inverters, and other well known types of delay circuits may be used instead of the inverters. Other delay circuits may include any circuit which uses a capacitance for a delay or any other known technique for providing a delay.

A flip-flop may be in the form of FIG. 2 or 3 or in another configuration. The flip-flop logic may be that used for any type of flip-flop such as a J-K, R-S, T or any other type of flip-flop. Additionally, not only flip-flops, but any other type of register or other sequential circuit element may use the novel reset/set circuitry along with the reset/set switching techniques without requiring any additional reset/set terminals or control signals. Other types of sequential circuits may include counters or other devices using registers. The flip-flops or other sequential circuit elements may form a part of any other larger circuit.

While particular embodiments of the present invention have been shown and described, it will be obvious to those skilled in the art that change and modifications may be made without departing from this invention in its broader aspects and, therefore, the appended claims are to encompass within their scope all such changes and modifications as fall within the true spirit and scope of this invention.

What is being claimed is:

1. A circuit comprising:
    a plurality of sequential circuits connected in a scan chain, a scan output terminal of one of said sequential circuits being electrically coupled to a scan input terminal of a next sequential circuit, at least one of said sequential circuits comprising:
        a first circuit connected to receive a scan enable signal for causing a scan output signal of at least one of said sequential circuits to be forced to a predetermined logic state by transitioning said scan enable signal between logic states, so that set and reset controls are not used for causing said scan output signal to be forced to said predetermined logic state.

2. The circuit of claim 1 wherein said first circuit comprises a first logic circuit for receiving said scan enable signal and for receiving a delayed scan enable signal from a delay circuit, where a signal output from said first logic circuit is a pulse having a duration of approximately a delay provided by said delay circuit.

3. The circuit of claim 2 wherein said pulse output from said first logic circuit forces said scan output signal of said at least one of said sequential circuits to a logical 1 or a logical 0 state.

4. The circuit of claim 2 wherein said delay circuit comprises one or more inverters connected between said scan enable signal and said first logic circuit.

5. The circuit of claim 1 further comprising a latch circuit for latching said predetermined logic state of said scan output signal.

6. The circuit of claim 1 wherein at least one of said sequential circuits is a flip-flop having a Q terminal and said scan output terminal, a signal on said scan output terminal being slaved to a signal on said Q terminal unless said scan output signal is set or reset using said first circuit, which sets or resets said scan output signal by transitioning said scan enable signal between logic states.

7. The circuit of claim 1 wherein said scan output signal of a plurality of said sequential circuits in said scan chain is reset to a logical 0 by transitioning said scan enable signal from a logical 1 to a logical 0.

8. The circuit of claim 1 wherein said scan output signal of a plurality of said sequential circuits in said scan chain is set to a logical 1 by transitioning said scan enable signal from a logical 1 to a logical 0.

9. The circuit of claim 1 wherein at least one of said sequential circuits has a scan output signal which can be reset upon transitioning said scan enable signal between logic states, and at least one of said sequential circuits has a scan output signal which can be set upon transitioning said enable signal between logic states.

10. The circuit of claim 1 wherein at least one of said sequential circuits comprises a plurality of said sequential circuits.

11. A circuit comprising:
a plurality of sequential circuits connected in a scan chain, a scan output terminal of one of said sequential circuits being electrically coupled to a scan input terminal of a next sequential circuit, at least one of said sequential circuits comprising:
a first circuit connected to receive a scan enable signal for causing a scan output signal of at least one of said sequential circuits to be forced to a predetermined logic state by transitioning said scan enable signal between logic states, comprising a NOR gate having a first input terminal connected to said scan enable signal and a second input terminal connected to a delayed scan enable signal.

12. The circuit of claim 11 wherein an output terminal of said NOR gate is electrically coupled to a pull down transistor for pulling down a node to cause said scan output signal to be latched to a logical 1 or a logical 0 state.

13. A circuit comprising:
a plurality of sequential circuits connected in a scan chain, a scan output terminal of one of said sequential circuits being electrically coupled to a scan input terminal of a next sequential circuit, at least one of said sequential circuits comprising:
a plurality of circuits connected to receive a scan enable signal for causing the scan output signal of at least one of said sequential circuits to be forced to a predetermined logic state by transitioning said scan enable signal between logic states, wherein alternative ones of said sequential circuits have scan output signals which can be reset upon transitioning said select enable signal between logic states, and alternate ones of said sequential circuits have scan output signals which can be set upon transitioning said select enable signal between logic states.

14. A method for diagnosing a scan chain, said scan chain comprising a series of sequential circuits, each of said sequential circuits having a scan enable signal applied to it to select a scan chain mode of operation, each of said sequential circuits having a scan output terminal and a scan input terminal, said method comprising the steps of:
transitioning said scan enable signal between logic states to force an output signal at a scan output terminal of a plurality of said sequential circuits to be at a predetermined logic state, without set or reset controls.

15. The method of claim 14 wherein said predetermined logic state is a 1.

16. The method of claim 14 wherein said predetermined logic state is a 0.

17. The method of claim 14 wherein at least one of said sequential circuits has a scan output terminal which is reset to 0, and at least one of said sequential circuits has a scan output terminal which is set to 1, upon transitioning said scan enable signal between logic states.

18. The method of claim 14 wherein said sequential circuits comprise flip-flops.

19. A method for diagnosing a scan chain, said scan chain comprising a series of sequential circuits, each of said sequential circuits having a scan enable signal applied to it to select a scan chain mode of operation, each of said sequential circuits having a scan output terminal and a scan input terminal, said method comprising the steps of:
transitioning said scan enable signal between logic states to force a scan output terminal of a plurality of said sequential circuits to be at a predetermined logic state, wherein alternate ones of said sequential circuits in said scan chain have scan output signals being at a logical 1 as the predetermined state and alternative ones of said sequential circuits in said scan chain have scan output signals at a logical 0 as the predetermined state.

* * * * *